United States Patent [19]

Coats

[11] Patent Number: 4,556,808
[45] Date of Patent: Dec. 3, 1985

[54] MICROWAVE MONOLITHIC SPDT FET SWITCH CONFIGURATION

[75] Inventor: Robert P. Coats, Dallas, Tex.

[73] Assignee: Texas Instruments Incorporated, Dallas, Tex.

[21] Appl. No.: 384,379

[22] Filed: Jun. 3, 1982

[51] Int. Cl.[4] .................. H03K 17/687; H03K 17/56; H01P 1/10

[52] U.S. Cl. .................... 307/571; 307/241; 307/244; 307/262; 333/164; 333/262

[58] Field of Search ............. 333/164, 138, 139, 140, 333/262; 307/241, 242, 244, 571–585, 550

[56] References Cited

U.S. PATENT DOCUMENTS

| | | | |
|---|---|---|---|
| 3,146,357 | 8/1964 | Spallone | 307/244 |
| 3,602,738 | 8/1971 | Bohm | 307/244 |
| 4,395,687 | 7/1983 | Belohoubek | 333/164 |
| 4,425,633 | 1/1984 | Swain | 333/164 |
| 4,471,330 | 9/1984 | Naster et al. | 333/164 |

Primary Examiner—Stanley D. Miller
Assistant Examiner—B. P. Davis
Attorney, Agent, or Firm—Carlton H. Hoel; Robert O. Groover; James T. Comfort

[57] ABSTRACT

A single-pole-double-throw microwave monolithic switch is realized by employing shunt connected field effect transistors interconnected with microstrip transmission lines on a gallium arsenide substrate. A low-pass network, configured with quasi-lumped elements, is used to achieve a 90° phase shift between the transistors and the input point. The FET gate width is selected to yield the appropriate source-drain capacitance, which forms one element of the low-pass network comprising the respective switch output path. Use of this inventive structure yields the bandwidth offered by the conventional shunt switch and the small size achievable in the series switch configuration.

14 Claims, 17 Drawing Figures

1(A) PRIOR ART    1(B) PRIOR ART    1(C)

$Z_I = \sqrt{Za(Za + 2Zb)}$ $\emptyset = 2\sin^{-1}\sqrt{Za/2Zb}$ $Y_I = \sqrt{Ya(Ya - 2Yb)}$ $\emptyset = 2\sin^{-1}\sqrt{Ya/2Yb}$

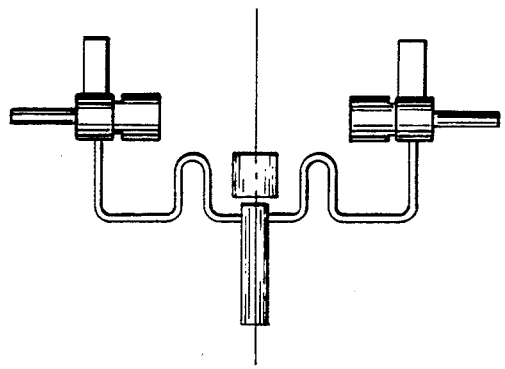
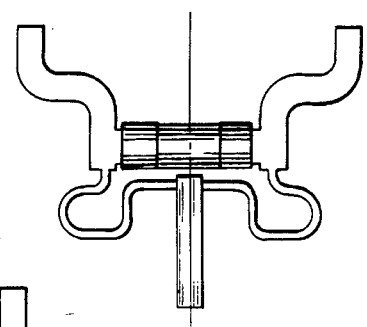
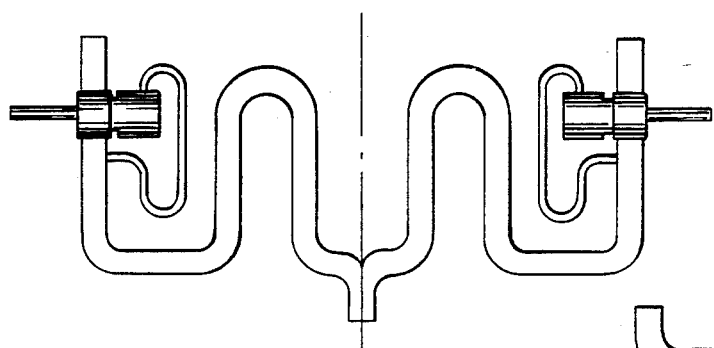
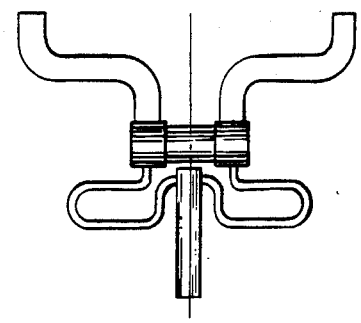
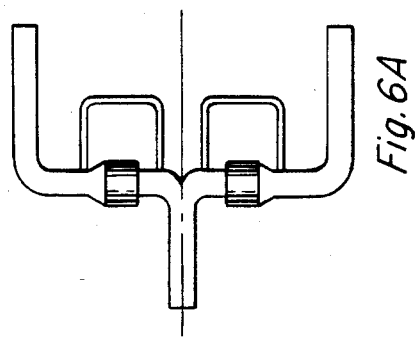

MICROWAVE MONOLITHIC SPOT FET SWITCH CONFIGURATION

BACKGROUND OF THE INVENTION

The present invention relates to a circuit for switching microwave energy between alternative paths.

SPDT microwave switches are currently realized in monolithic form by using resonated field effect transistors connected in either series or shunt with the output transmission line. For the case of the series configuration, isolation in the "off" path of the switch is realized by biasing the gate to pinch-off the channel. At high microwave frequencies, the drain-source capacitance shunting the high resistance state of the FET severely degrades the isolation values obtainable with the switch. By use of an inductive element to parallel resonate the drain-source capacitance, suitable values of isolation can be obtained, but only over a narrow frequency band.

A configuration utilizing shunt connected FETS has been realized by spacing the devices one-quarter wavelength away from the junction. In this configuration, due to the impedance transformation (phase shift) effected by the quarter-wavelength line, the circuit branch is "on" when the corresponding device is "off", and vice versa. The devices are again parallel resonated to obtain low loss in the "on" state. Broader isolation bandwidth is achievable with this configuration because the "off" branch is realized with the FET in the inherently wideband, low resistance "on" state. However, the shunt configuration requires nearly twice the area of the series switch, a distinct disadvantage in most monolithic applications.

SUMMARY OF THE INVENTION

The manner in which the novel switch configuration of the present invention differs from the more conventional forms is seen by use of FIG. 1. This figure shows circuit schematics for three different SPDT FET switch configurations. FIG. 1(a) depicts the parallel-resonant series switch. The shunt version of this switch, illustrated in FIG. 1(b), uses the same parallel-resonated FETS, but requires a quarter wavelength transmission line in both branches of the switch. Both types of switches require that the source drain capacitance be parallel resonated to obtain optimum performance.

The present invention, a novel alternative to the conventional shunt SPDT configuration, is shown in FIG. 1(c). This approach, the integrated lumped-element shunt switch, consists of two nonresonated FETs integrated with lumped-element pi-networks that simulate the quarter-wavelength transmission lines of the conventional shunt switch.

According to the present invention, there is provided: a microwave switch, for selectively switching microwave energy at approximately a known operating frequency between an input line and either a first or a second output line, said input and first and second output lines all having a first impedance, said switch comprising: first and second FETs, each said FET being connected to a respective one of said output lines; first and second quasi-lumped inductors, each said respective inductor being connected between a respective one of said FETs and said input line; and a capacitor connected to said input line; wherein the values of said capacitor, of said quasi-lumped inductances, and of the source/drain capacitances of said FETs are selected to impose a phase shift of approximately 90° between said FET and said input line at said operating frequency.

BRIEF DESCRIPTION OF THE DRAWINGS

The present invention will be described with reference to the accompanying drawings, wherein:

FIGS. 6A–6E show alternative microwave switch physical configurations;

DESCRIPTION OF THE PREFERRED EMBODIMENTS

The present invention uses a lumped capacitance and a lumped inductance to form a matching network, including the source/drain capacitance of the active device, to effect 90° of phase shift in each leg of the spdt FET switch.

Figure 2A:
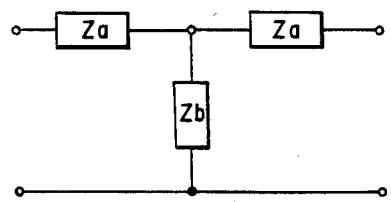
FIGS. 2A and 2B show lumped element network forms which may be used for matching.
Figure 2B:
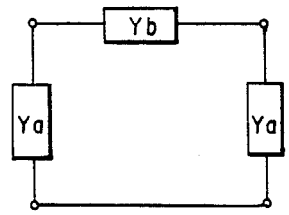
Figure 3:
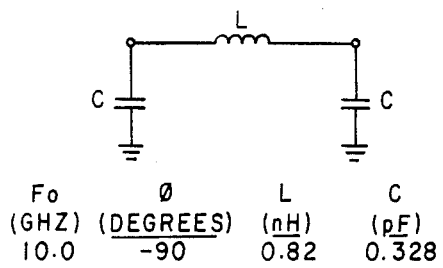
FIG. 3 shows a pi-network such as preferably used in practicing the present invention.

The element values of the lumped-element circuit are determined by use of the image parameters of the structures. Both the image impedance, $Z_1$, and the image propagation function, $\gamma$, can be written in terms of the element impedances or admittances. If the network is considered lossless, the image attenuation function $\alpha$ becomes zero, and the image propagation function reduces to the form of the image phase. If the network is embedded in transmission line of characteristic impedance equal to the image impedance, the image phase $\phi$ becomes the transfer phase characteristic of the network. By specifying the image impedance, $Z_1$, and image phase $\phi$, unique values can be obtained for the elements that make up a network. The form of the networks and the equations relating the image impedance and image phase to the element values are shown in FIG. 2. In order to replace the quarter-wavelength lines required by the conventional shunt switch, a smaller network having image impedance of 50 ohms and phase lag of 90 degrees at center frequency band is used. At X-band, in the presently preferred embodiment, this becomes the low-pass pi network form shown in FIG. 3.

When two such pi-networks are joined in an SPDT configuration, the shunt capacitors on the input are preferably combined as a single capacitor, and the source-drain capacitances of the switching FETs are preferably used for the output shunt capacitors. Integrating the FET with the pi-network eliminates the need to resonate the source-drain capacitance, since that capacitance becomes a necessary and integral part of the circuit. This approach exhibits the wide bandwidth of the conventional shunt switch, but only requires roughly the same chip area used in the more compact, but narrowband series switch.

Thus, application of a DC voltage to the gates of the FETs so that one FET is pinched off and the other is full on, produces efficient microwave switching with wide-band isolation.

In an alternative embodiment, an additional lumped capacitor to ground is used between each FET and the corresponding inductor. This means that the gate width of the FET need not be extended to achieve adequate capacitance. This is particularly useful at lower microwave frequencies, when very long gate widths would otherwise be required.

Figure 4:
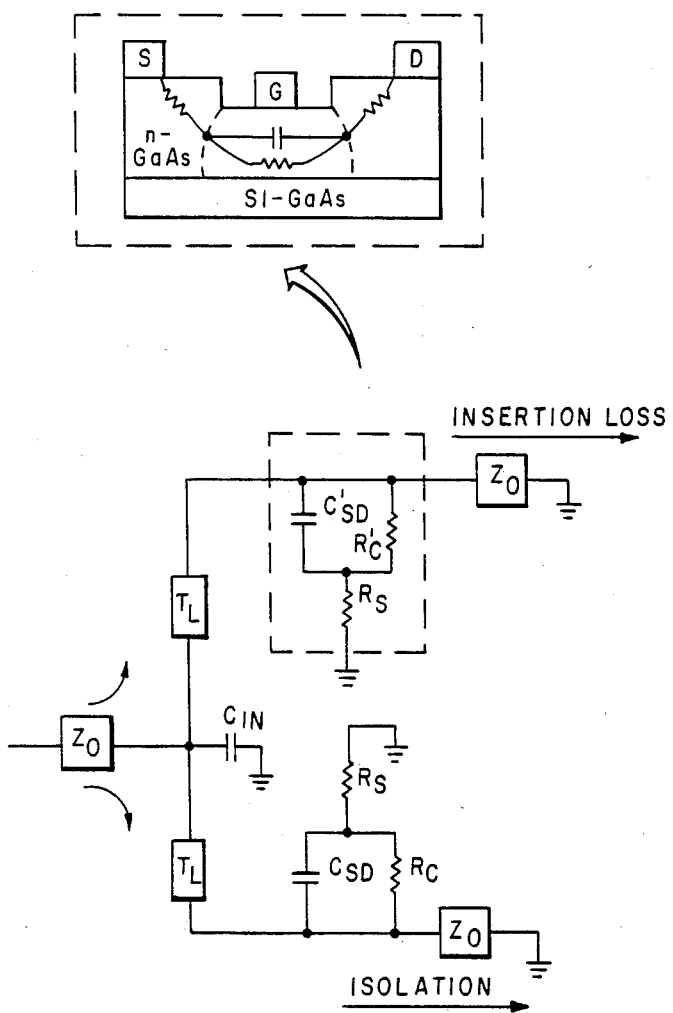
FIG. 4 shows an equivalent circuit of the switch configuration of the present invention, in which the active FETs have been approximated by linear elements.

A relatively simple model explains the basic features of the integrated lumped element switch configuration. The equivalent circuit model of the switch is shown in FIG. 4. The output of the on-branch is labelled "insertion loss", while the output of the off-branch is labelled "isolation". The FET in the on-branch of the switch is modeled as a high resistance $R_c$, shunted by a source-drain capacitance $C_{SD}'$, which has a series resistance loss $R_s$, as shown inside the dashed rectangle in FIG. 4. The physical basis for this FET model (biased to pinch-off the channel under the gate) is shown in the cross section drawing of the device. The dominant capacitance is the depletion capacitance of the pinched-off FET channel. The series resistance, $R_s$, corresponds to the region between the depleted channel and the "source" and "drain" contacts. The model of the FET in the switch off-branch consists of a low resistance Rc shunted by a slightly modified value of source-drain capacitance $C_{SD}$ (consisting primarily of geometrical capacitance between "source" and "drain" contacts), together with the series resistance loss Rs. High impedance transmission lines approximate the resonant inductors required in the low-pass pi-networks.

Figure 5:
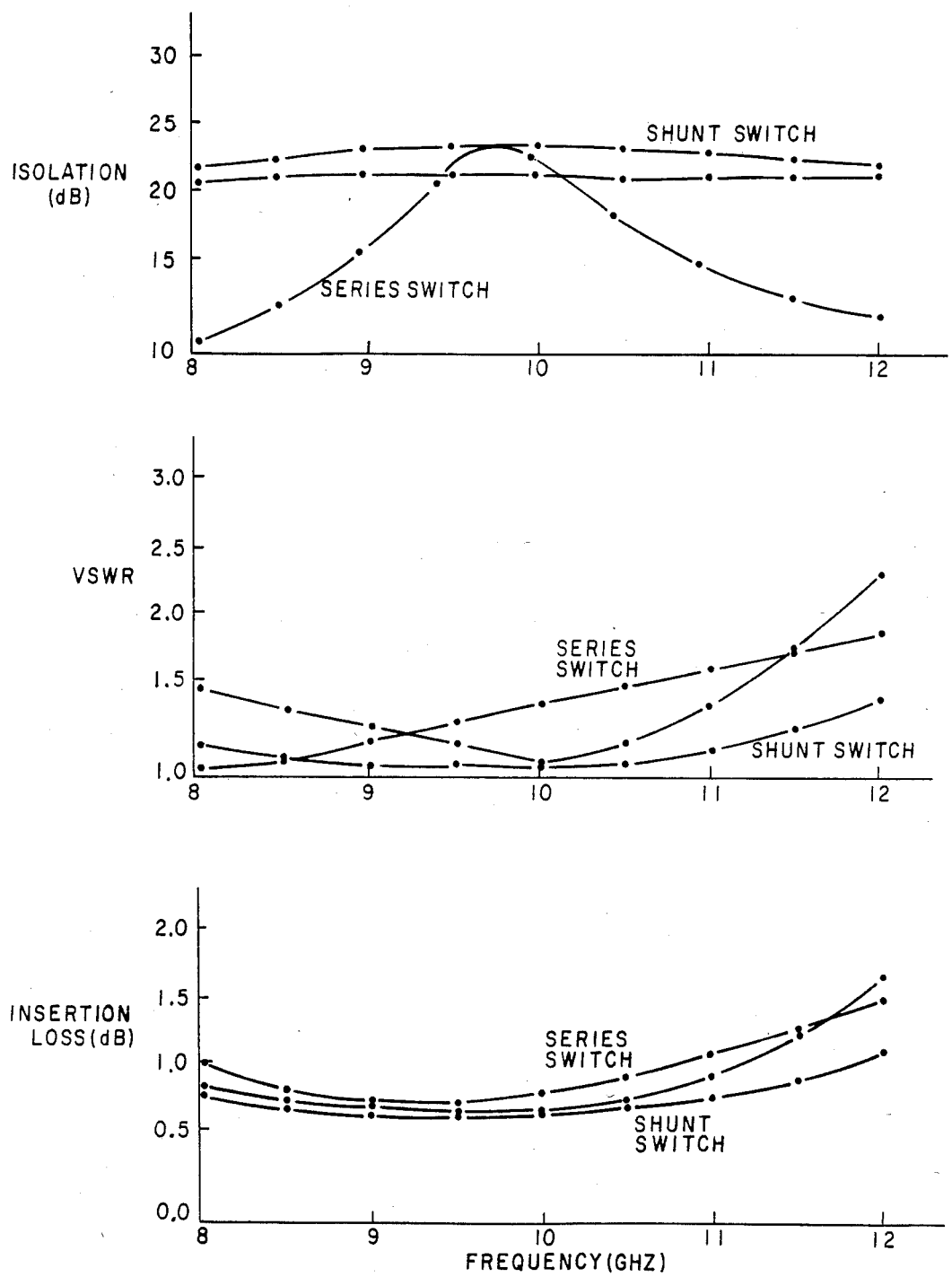
FIG. 5 compares performance of the switch configuration of the present invention with the performance of the two prior art switch configurations as shown in FIG. 1, as indicated by simulation runs.
Figure 7:
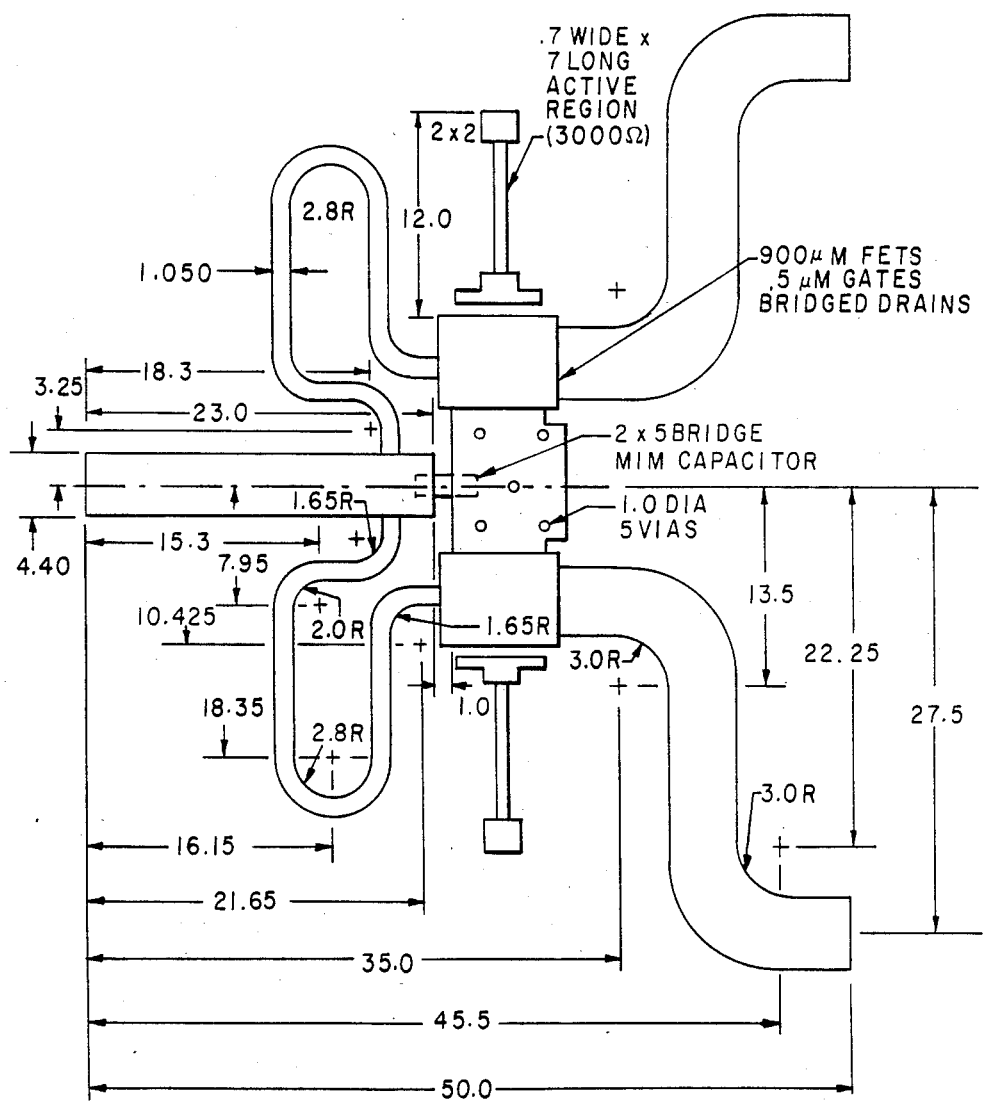
FIG. 7 shows the specific layout, with dimensions in 1000nths of an inch, for the presently preferred embodiment of the present invention.
Figure 8:
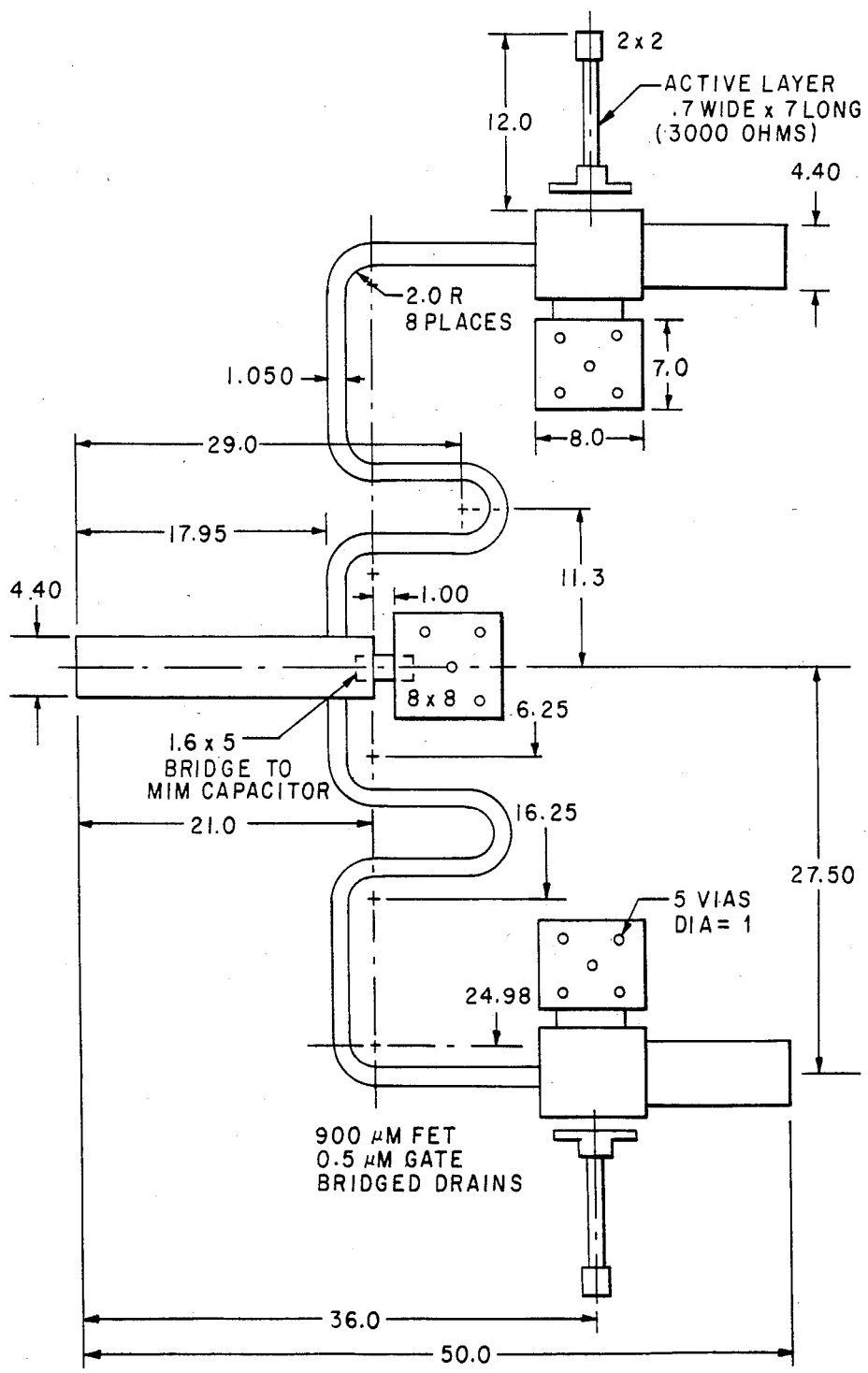
FIG. 8 shows a specific layout, with the dimensions in 1000nths of an inch, for a second alternative embodiment of the present invention.
Figure 9:
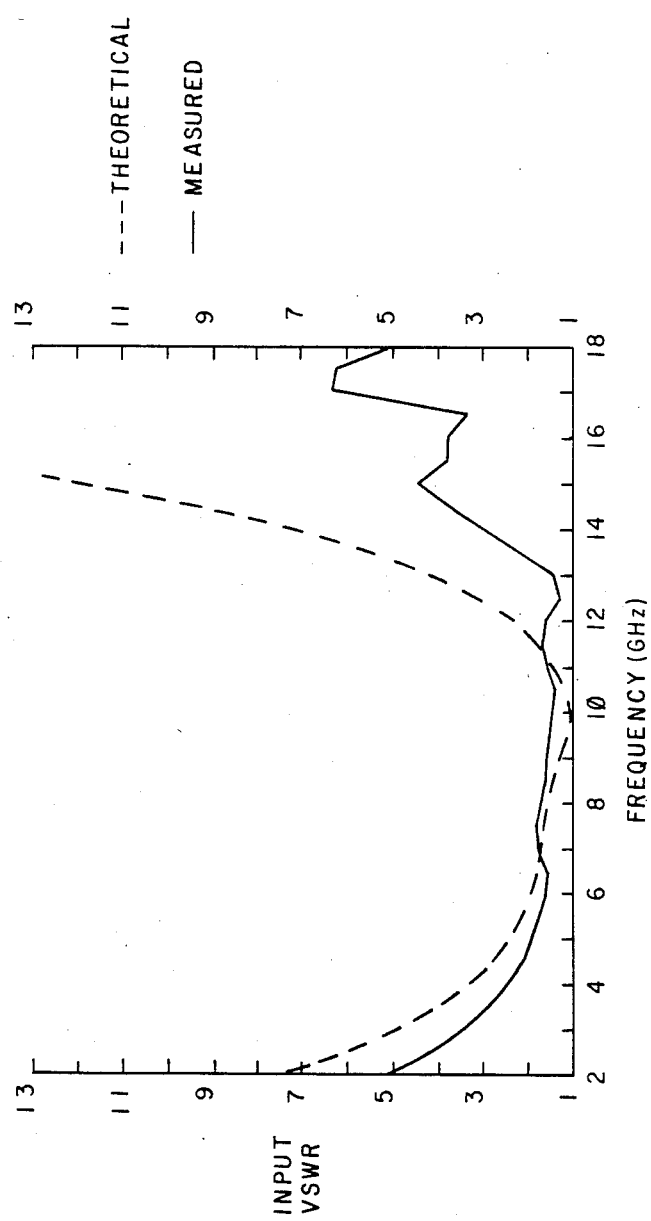
FIG. 9 shows input vswr characteristics of the switch of the present invention.
Figure 10:
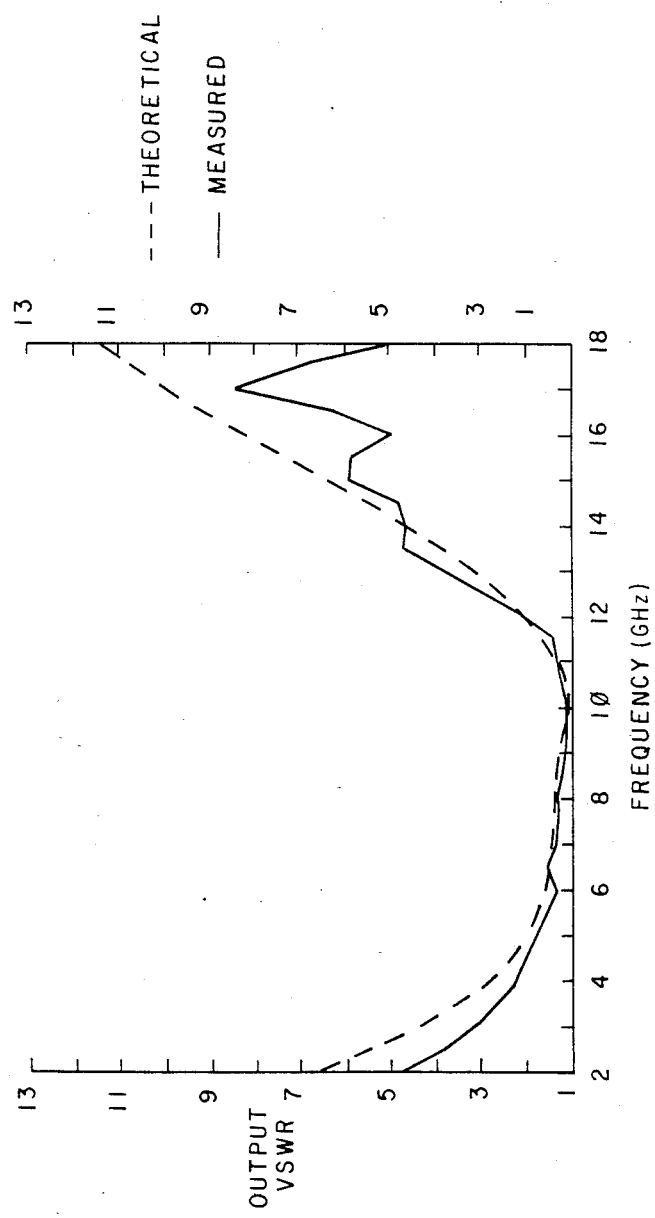
FIG. 10 shows output vswr characteristics of the switch of the present invention.
Figure 11:
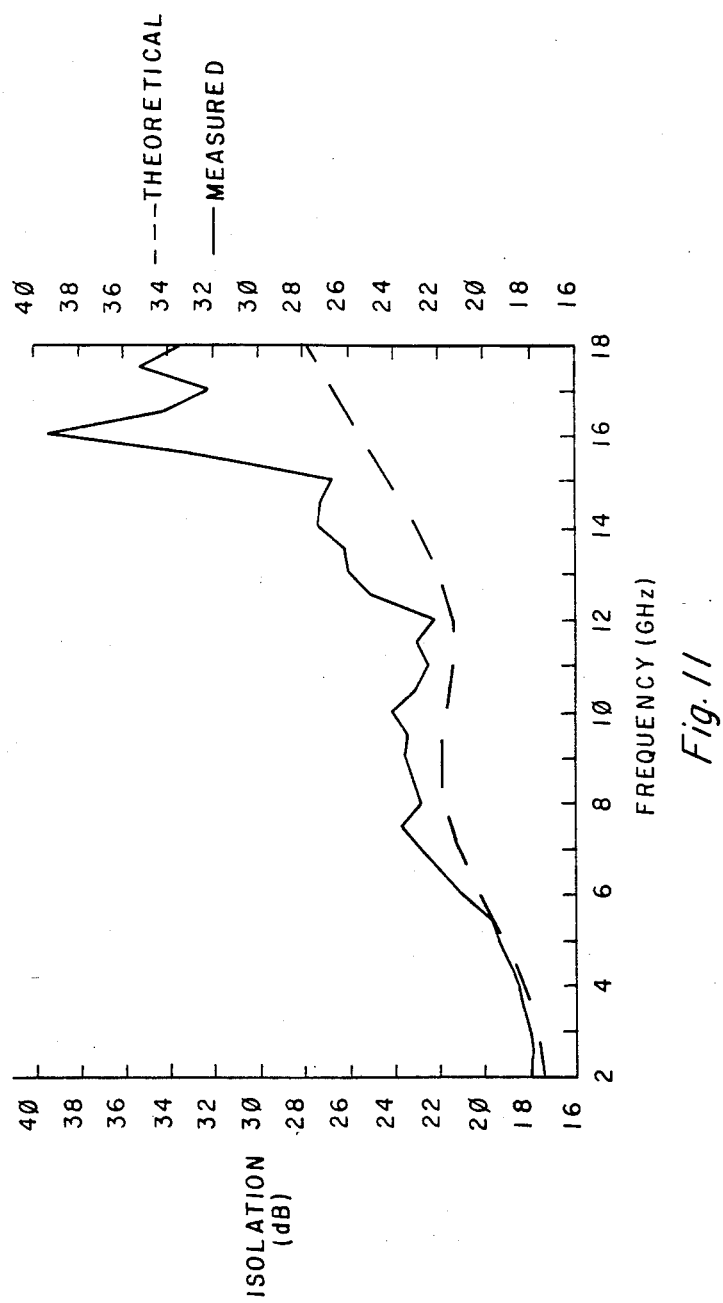
FIG. 11 shows isolation characteristics of the switch of the present invention.
Figure 12:
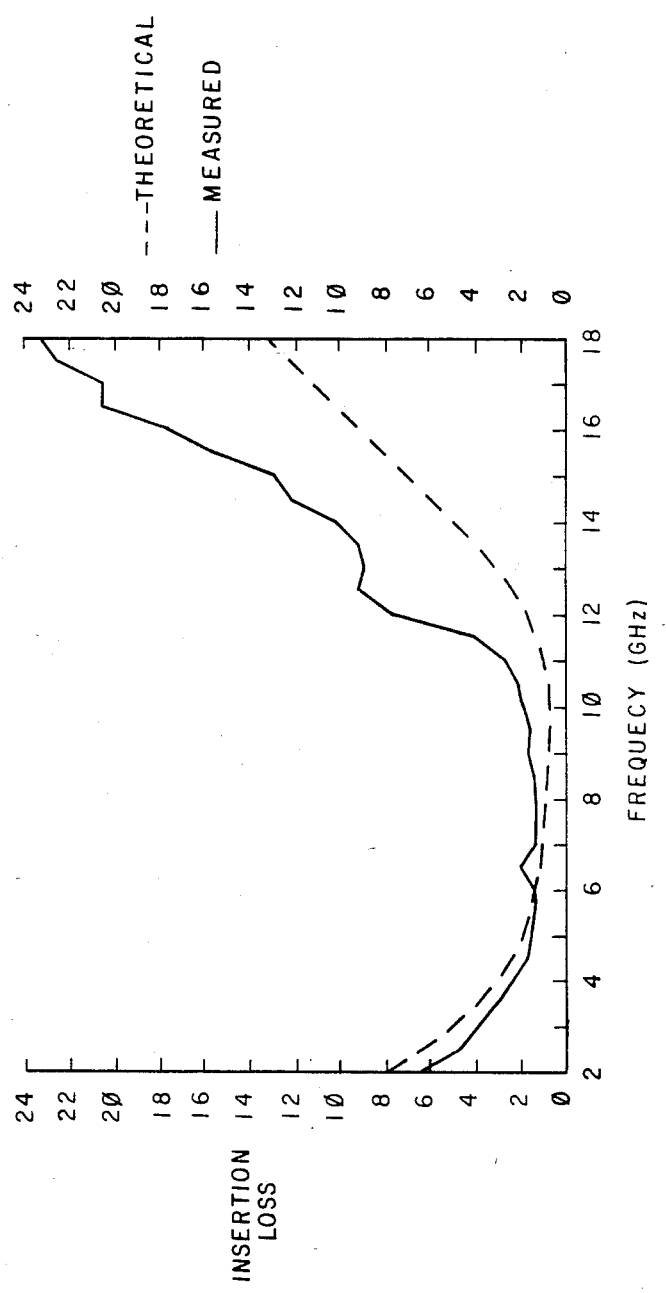
FIG. 12 shows the insertion loss versus frequency characteristics of the switch of the present invention.

In order to develop a switch configuration of the new form, it is necessary to choose the FET gate width that yields the source-drain capacitance required by the low-pass networks comprising the two switch output paths. From FIG. 3, it is seen that a switch designed to operate at 10 GHz in 50 ohm transmission line requires a source-drain capacitance value of approximately 0.3 picofarads. This value of source-drain capacitance is obtained using a FET with a 900 micron wide, half micron long gate. The values of lumped elements comprising the model for this FET are: Rs=3.2 ohm, Rc=1.2 ohm, Rc'—50K ohm, and C~C'~0.29 pf. The inductor is realized, in a sample embodiment, by a 0.098-wavelength length of 83 ohm transmission line. Optimization of this configuration requires an input capacitor value of 0.52 pf. Fabrication of this switch on 0.006 inch thick GaAs substrate yields an attenuation constant for 83-ohm line at X-band of 0.50 dB/cm. Computed performance of this switch and the two more conventional forms (using 900 micron FETs) is shown in FIG. 5.

Figure 1:
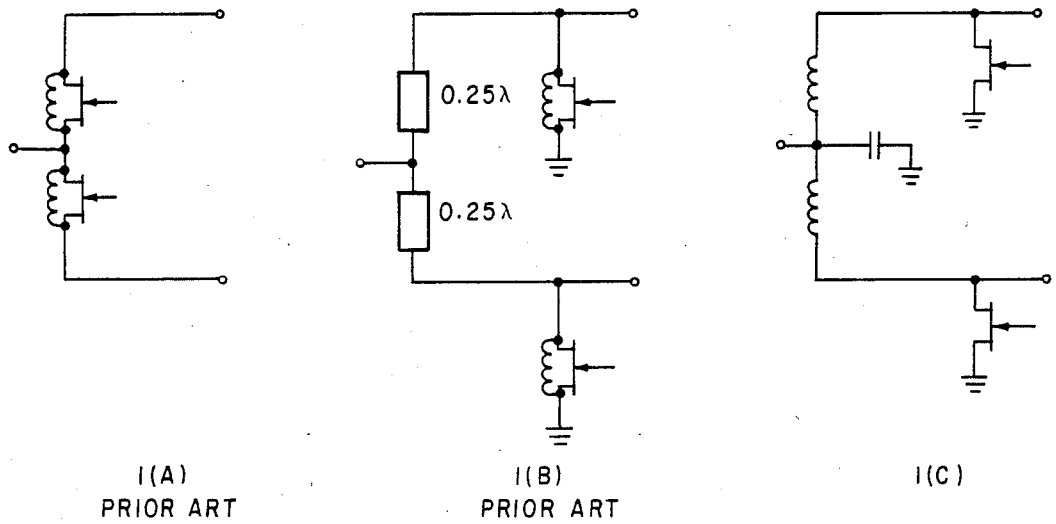
FIG. 1 shows the switch configuration of the present invention together with two prior-art switch configurations.

The form and relative size of switches considered are shown in FIG. 6. The three switches shown at the top of the figure are the same as those shown schematically in FIG. 1. The novel integrated lumped element switch form shown at the right has separate via holes provided for the FETs and the input capacitor (three total). The two integrated lumped element forms shown below each have a single common via grounding hole. All of these switch forms have been fabricated on 6 mil GaAs substrate and the three via form of the integrated lumped element switch has been shown to function as predicted. Performance data for the three via form of the switch is shown in FIGS. 9 through 12.

The value of the lumped capacitor at the input is $1/(\pi \cdot f \cdot z_0)$, where $z_0$ is the input impedance and f is the frequency. The value of each lumped inductance is $z_0$ over $(2 \pi \cdot f)$. The source/drain capacitance of the active element in each branch is adjusted to $1/(2 \pi \cdot f \cdot z_0)$, by using an appropriately long gate. (Source/drain capacitance in a conventional MESFET is simple a linear function of a gate width.)

Where the lumped inductance is approximated by a short portion of higher-impedance line, the higher-impedance line portion will also contain a certain amount of distributed capacitance. Thus, the lumped capacitance values calculated above are preferably reduced by around 10%, to allow for the distributed capacitance and for the phase shift induced by the finite length of the higher-impedance transmission line used to approximate the lumped inductance.

An advantage of using the higher-impedance line approximation is that it provides a far more compact replacement for the quarter-wave delay lines taught in the prior art. The higher-impedance line is not only shorter than the prior art delay line, it is also substantially more compact. As seen in the layouts of FIG. 6, the high-impedance lines used to approximate inductances are much narrower than are lines matched to the input, and can be put through much sharper radius bends.

In the presently preferred embodiment, the lumped capacitor at the input is configured as a MIM capacitor, comprising a silicon nitride dielectric, 300 nanometers thick, between two metal plates, where the area of the smaller plate is two by two mils.

In the presently preferred embodiment, the lumped inductance is configured by means of high-impedance transmission line. That is, in a circuit where the input and output impedances are 50 ohms, a length of 83 ohm or 110 ohm line will act effectively as a lumped inductance. Alternatively, other ways to configure a lumped inductance, such as a spiral with a via in the center, may be used. However, since transmission line impedance is selected in a monolithic microwave integrated circuit merely by adjusting the width, use of a higher-impedance mismatched portion of transmission line provides the most convenient way to configure a small inductance. Thus, for example, where metal is deposited to a thickness of 1600 nanometers on a semi-insulating gallium arsenide substrate, a 50 ohm line will have a width of 4.40 mils, an 82 ohm line will have a width of 1 mil, and a 110 ohm line will have a width of 0.30 mils. At microwave frequencies, no practical circuit element is precisely a lumped element: that is, almost every circuit element will have a dimension in the circuit path which is a significant fraction of a wavelength. In particular, portions of higher-impedance mismatched transmission line have significant distributed characteristics, but are still very different in behavior from matched transmission line. Such elements are generically referred to in the art as "quasi-lumped elements".

What is claimed is:

1. A microwave switch, for selectively switching microwave energy at approximately a known operating frequency between an input line and either a first or a second output line, said input and first and second output lines all having a first impedance, said switch comprising:

first and second FETs, each said FET being shunt connected to a respective one of said output lines;

first and second quasi-lumped inductors, each said respective inductor being connected between a respective one of said FETs and said input line; and a capacitor connected to said input line;

wherein the values of said capacitor, of said quasi-lumped inductances, and of the source/drain capacitances of said FETs are selected to impose a phase shift of approximately 90° between said FET and said input line at said operating frequency.

2. The switch of claim 1, wherein said quasi-lumped inductor comprises a segment of transmission line which is less than one quarter of a wavelength long at the relevant operating frequency, and which has a higher impedance than said first impedance.

3. The switch of claim 1, wherein each said FET is a MESFET having a gate length of less than one micron.

4. The switch of claim 2, wherein said operating frequency is greater than one gigahertz.

5. The device of claim 1, 2, 3, or 4, wherein said respective transmission lines comprise strips of metal deposited on semi-insulating semiconductor substrate, and said active devices are respectively formed in proximity within a surface of said semiconductor substrate.

6. The device of claim 5, wherein said capacitor comprises a metal-insulator-metal capacitor.

7. The switch of claim 1, wherein said capacitor has a value which is approximately equal to one over (the value of said operating frequency, times the value of said first impedance, times 3.14).

8. The switch of claim 7, wherein each said FET comprises a source/drain capacitance which is approximately equal to one half the capacitance of said capacitor.

9. The switch of claim 7, wherein said quasi-lumped inductor is approximately equal to said first impedance divided by (said operating frequency times 6.28).

10. The switch of claim 2, wherein said quasi-lumped inductor comprises an inductance which is approximately equal to 0.9 times said first impedance, divided by (6.28 times said operating frequency).

11. The switch of claim 2, wherein said quasi-lumped inductor comprises a segment of transmission line having an impedance which is more than one and one half times the value of said first impedance.

12. The switch of claim 5, wherein each said quasi-lumped inductor comprises a strip of metal having a first width, and said input and output lines each comprise respective strips of metal each having a second width, said second width being more than three times said first width.

13. The switch of claim 12, wherein all of said strips of metal have approximately identical thickness.

14. The device of claim 5, wherein said semi-insulating semiconductor substrate comprises gallium arsenide doped with chromium.

* * * * *